United States Patent [19]
Doyle

[11] Patent Number: 6,054,370
[45] Date of Patent: Apr. 25, 2000

[54] METHOD OF DELAMINATING A PREFABRICATED TRANSISTOR LAYER FROM A SUBSTRATE FOR PLACEMENT ON ANOTHER WAFER

[75] Inventor: Brian S. Doyle, Cupertino, Calif.

[73] Assignee: Intel Corporation, Santa Clara, Calif.

[21] Appl. No.: 09/107,393

[22] Filed: Jun. 30, 1998

[51] Int. Cl.$^7$ .............................. H01L 21/30; A01L 21/46
[52] U.S. Cl. ........................ 438/456; 438/457; 438/458; 438/459; 438/915
[58] Field of Search ..................................... 438/456–459

[56] References Cited

U.S. PATENT DOCUMENTS

| | | |
|---|---|---|
| 5,238,875 | 8/1993 | Ogino . |
| 5,374,564 | 12/1994 | Bruel . |
| 5,494,835 | 2/1996 | Bruel . |
| 5,559,043 | 9/1996 | Bruel . |
| 5,714,395 | 2/1998 | Bruel . |
| 5,863,832 | 1/1999 | Doyle et al. . |
| 5,877,070 | 3/1999 | Goesele et al. . |
| 5,882,987 | 3/1999 | Srikrishnan . |
| 5,949,108 | 9/1999 | Doyle . |
| 5,953,622 | 9/1999 | Lee et al. . |

FOREIGN PATENT DOCUMENTS

| | | |
|---|---|---|
| 0 807 970 | 5/1997 | European Pat. Off. . |
| 2 758 907 | 1/1997 | France . |

OTHER PUBLICATIONS

Bruel et al, "'Smart Cut': A promising new SOI Material Technology," Proc. 1995 IEEE international SOI Conf., pg. 178–179, Oct. 1995.

Roberds, et al "Control of the size and spactial location of viods in silicon by helium and hydrogen implantation," Proceedings 1998 IEEE International SOI Conf., pg. 33–34, Oct. 1998.

Aspar et al "Kinetics of splitting in the Smart–Cut Process," Proc. 1998 IEEE INternational SOI Conf., pg 137–138, Oct.

"Methods for fabricating a self–aligned dual–gate structure on an SOI sbustrate" IBM Tech. Discl. Bul. vol. 39, No. 7 pg. 163–167, Jul. 1996.

"SOI interposer structure," IBM Tech. Discl. Bul. vol. 39, No. 7, ppg. 191–195, Jul. 1996.

Aspar et al "Transfer of structured and patterned thin silicon films using the Smart–Cut process," Electronic Letters vol. 32, No. 21, ppg. 1985–1986, Oct. 10 1996.

Bruel et al, "Smart–Cut: A new silicon on insulator material technology based on Hydrogen implantation and wafer bonding," Jap. J. Appl. Phys. Part 1; Reg. Papers, Short Notes and Reviews, vol. 36, 1ss, 3B pp. 1636–1641, Mar. 1997.

Roberds et al, "Investigation of a novel self–aligned dual gate MOSFET structures, " Proc. 1998 IEEE International SOI CONF. pp. 109–110, Oct. 1998.

*Primary Examiner*—Richard Booth
*Assistant Examiner*—Jonathan Hack
*Attorney, Agent, or Firm*—Blakely, Sokoloff, Taylor & Zafman LLP

[57] ABSTRACT

A method of fabricating a film of active devices is provided. First damaged regions are formed, in a substrate, underneath first areas of the substrate where active devices are to be formed. Active devices are formed onto the first areas. Second damaged regions are formed, in the substrate, between the first damaged regions. The film is caused to detach from a rest of the substrate at a location where the first and second damaged regions are formed.

16 Claims, 7 Drawing Sheets

METHOD OF DELAMINATING A PRE-FABRICATED TRANSISTOR LAYER FROM A SUBSTRATE FOR PLACEMENT ON ANOTHER WAFER

BACKGROUND INFORMATION

(1) Field of the Invention

The present invention generally relates to fabrication of semiconductor devices. More specifically, the present invention relates to fabrication of integrated circuits that utilize prefabricated transistor layers.

(2) Description of Related Art

Modern integrated circuits are generally made up of a silicon substrate containing millions of active and passive devices including transistors, capacitors, resistors, etc. Until recently, the semiconductor industry's focus was on reducing the two dimensions, (X-Y) in a Cartesian system of coordinates, of the transistors to reduce the size of the integrated circuit. However, as integration in two dimension has become more and more difficult due to limitations of lithography tools, the exploitation of the third dimension (Z dimension in a Cartesian system of coordinates) has become increasingly attractive.

Figure 1:
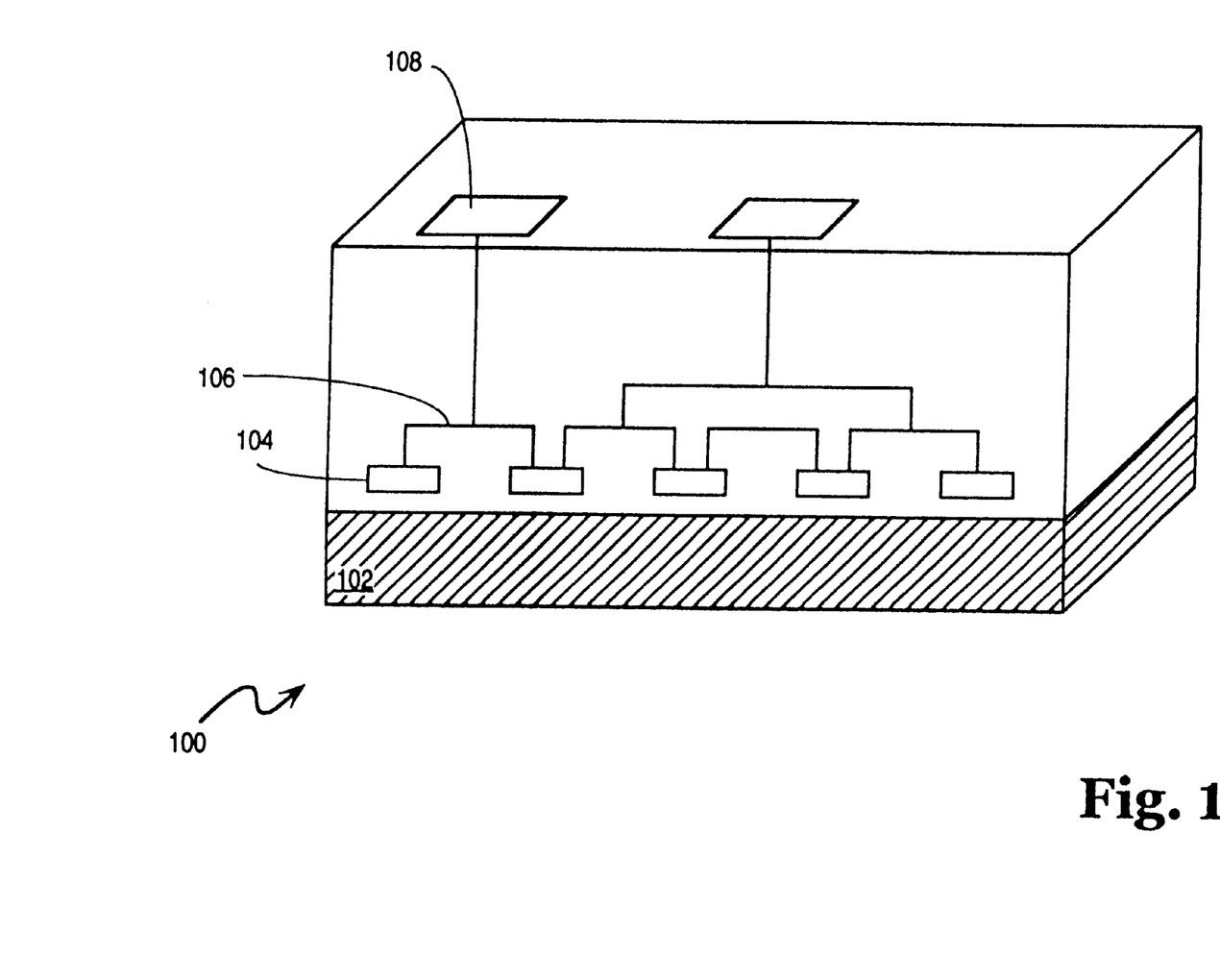
FIG. 1 illustrates a cross-sectional view through a conventional integrated circuit.

FIG. 1 illustrates a conventional integrated circuit 100 that includes a substrate 102 (typically made of silicon) onto which a very large number of active devices (transistors 104) are fabricated. Transistors 104 are intercoupled therebetween and to other devices, therefore forming various circuits, by way of an interconnect system that includes metal lines (106). The metal lines may further be connected to other circuits. The various circuits formed are further coupled, by well-known techniques, to bond pads 108 of the integrated circuit. Transistors 104 are therefore located on a single layer of silicon at the bottom of the integrated circuit. When the dimension of the gates of transistors 104 goes some way beyond 193 nanometers, which is the shortest wave length of the light used in the present day photolithography process, integration of transistors becomes problematic as lithography tools that are utilized in the process of fabrication of these transistors reach the limit of their performance. One solution to increasing integration without further having to minimize transistors' gates dimensions and thus without resorting to new lithography tools, is to build up further layers of transistors in a third dimension (Z dimension) as illustrated in FIG. 2.

Figure 2:
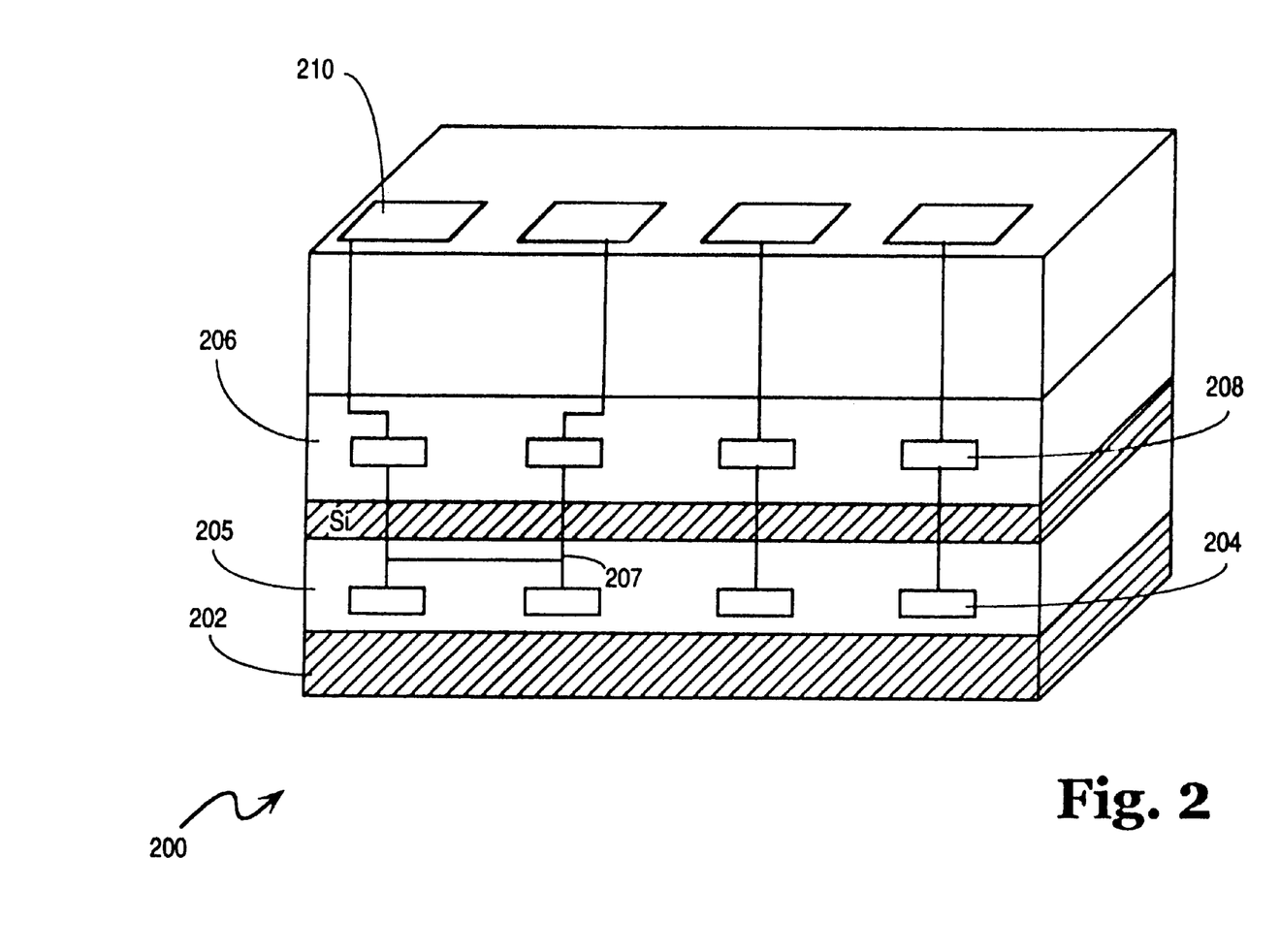
FIG. 2 illustrates a cross-sectional view through a integrated circuit with two layers of transistors superposed in the Z dimension.

FIG. 2 illustrates an integrated circuit that includes a first silicon substrate (base substrate 202) onto which are built a first layer (film) 205 of active devices 204. A second layer (film) 206 of active devices 208 may be envisioned as being further built in the Z dimension (vertically in the Figure). Interconnect lines 207 intercouple the active devices 208 of second layer 206 to the active devices 204 of first layer 205. The second layer 206 of active devices 208 may be coupled to the outside world via bond pads 210.

In the image area (imaging) attempts have been made to integrate transistors in the third dimension. For example, some digital cameras use chips that have at the bottom thereof (at the base silicon substrate) transistors for logical operations and on top of those transistors are built image sensors. For example, image sensor arrays may be built in the third dimension and used as light sensors. However, these transistors do not have good conducting properties, and therefore their performance is weak. These second-layer transistors are not made of a single-crystal silicon but are made of a polycrystalline silicon or amorphous silicon. The problem in providing a second layer of active devices (transistors) made of a single silicon crystal is that the fabrication of the second level of transistors requires processing steps that are performed at temperatures that are well beyond the temperature that the interconnect system may withstand. For example, at 400° or 450° Celsius, the metal lines begin to melt. It is desirable to provide an integrated circuit that utilizes at least two layers of transistors that offer competitive performance at lower costs. It is desirable to provide an integrated circuit with a second level of transistors in the Z dimension made of a single crystal silicon.

SUMMARY OF THE INVENTION

The present invention provides a method of fabricating a film of active devices. First damaged regions are formed, in a substrate, underneath first areas where active devices are to be formed. Active devices are formed onto the first areas. Second damaged regions are formed, in the substrate, between the first damaged regions. The film is caused to detach from a rest of the substrate at a location where the first and second damaged regions are formed.

BRIEF DESCRIPTION OF THE DRAWINGS

The features, aspects, and advantages of the present invention will become more fully apparent from the following Detailed Description, claims, and accompanying drawings in which:

DETAILED DESCRIPTION

In the following description, numerous specific details are set forth to provide a thorough understanding of the present invention. However, one having ordinary skill in the art should recognize that the invention may be practiced without these specific details. In some instances, well-known circuits, structures, and techniques have not been show in detail to avoid obscuring the present invention.

The present invention provides a method of fabricating a film of active devices. The film of active devices may later be bonded, in the third dimension, to another wafer that already has a first film of active devices built therein. Thus, by using the film of active devices fabricated by way of the process according to an embodiment of the present invention described herein an integrated circuit, with two layers of transistors built in the third dimension, may be fabricated.

To form a second film of active devices and then delaminate this film without damaging the active devices, the embodiment of the process according to the present invention predamages regions in a substrate at a first distance underneath first areas. The first areas are areas, at the top of the substrate, where active devices are to be formed. Active devices are then formed onto the first areas. Second damaged regions are then formed in the substrate between the first damaged areas. The first and second damaged regions form an overall damaged region that may later be exposed to forces (energy) that delaminate the film from the rest of the substrate thereby obtaining a film of active devices in a simple and inexpensive way.

Figure 3:
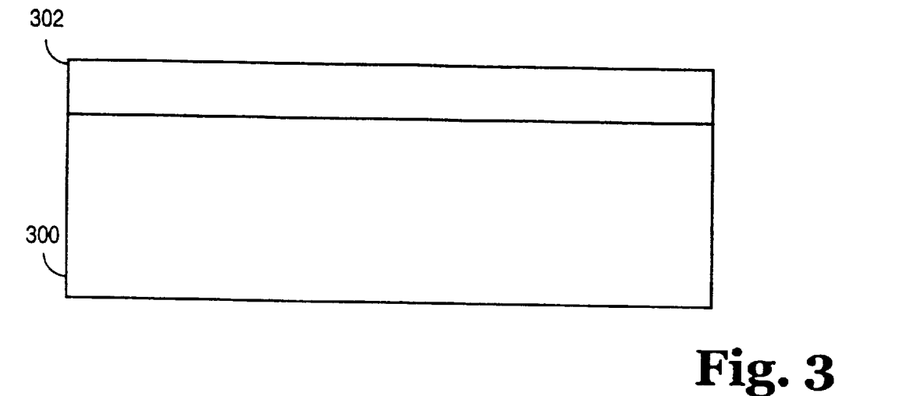
FIG. 3 illustrates a cross-sectional view through a substrate onto which a layer of isolating material is deposited for patterning.

FIG. 3 illustrates a cross-sectional view through a substrate 300, that may be made of silicon, onto which a layer (film) (not shown) of active devices (transistors) (not shown) may be formed according to one embodiment of the process of the present invention. A layer of photosensitive material such as photoresist 302 or of other masking materials is deposited on silicon substrate 300 to be later patterned and etched to form a reverse isolation mask (not shown). The patterning and etching of layer 302 may be performed by conventional ways well-known in the art.

Figure 4:
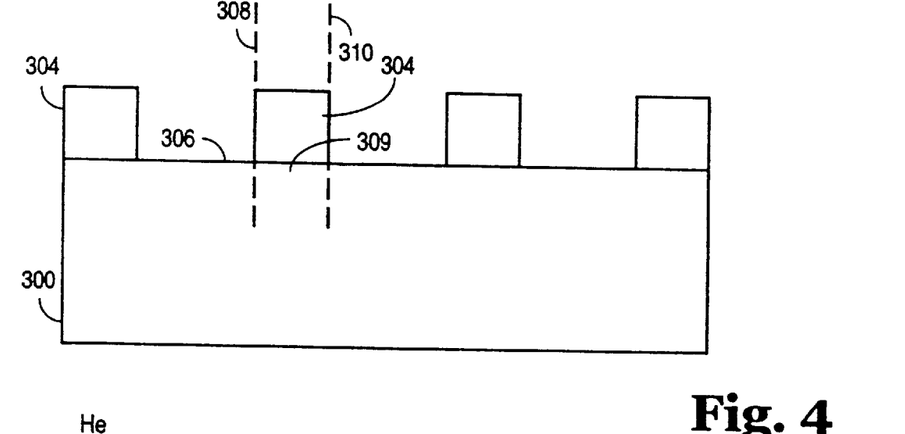
FIG. 4 illustrates a cross-sectional view through the substrate with patterned areas that mask areas located between areas where active devices are to be formed.

FIG. 4 illustrates a cross-sectional view through the silicon substrate 300 after the layer of photoresist shown in FIG. 3 has been patterned and etched to form patterned areas (reverse isolation mask) 304. Patterned areas 304 mask horizontal areas 309 defined by dotted lines 308 and 310. Areas 309 are areas that separate therebetween active devices that will later be formed upon areas 306. Areas 306 are thus left exposed, while areas 309, that separate therebetween areas 306, are masked.

Figure 5:
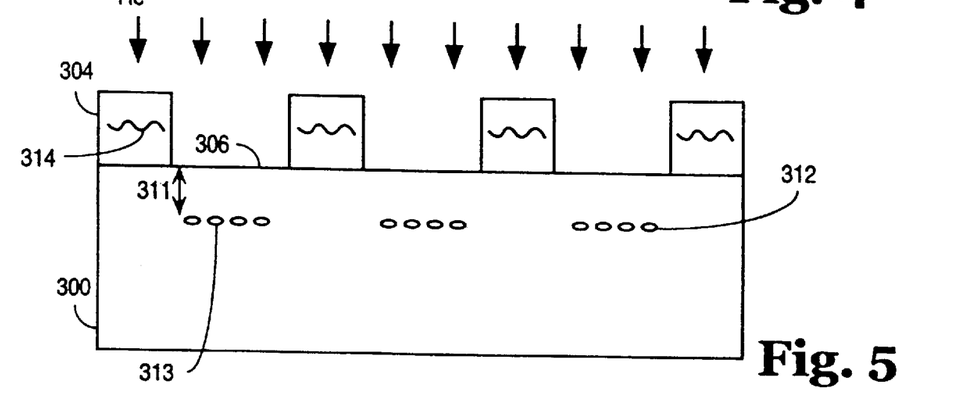
FIG. 5 illustrates a cross-sectional view through the silicon substrate subjected to a first implantation process.

FIG. 5 illustrates a cross-sectional view through the patterned structure of FIG. 4 that is subjected to a process of helium implantation to form first damaged regions 312 into the substrate. Note that helium is not the only substance that may be used for implanting the substrate but other substances may be utilized as well. Such substances include combinations of helium and hydrogen, or of helium, hydrogen and oxygen, or of other noble gases alone or in combinations with hydrogen or in combination with hydrogen and oxygen. Such substances may be any implanted species or series of species that damage the silicon, the damage remaining subsequent to high temperature fabrication processes.

Helium or combinations thereof type of implants, for example, selectively produce first damaged regions 312 underneath first areas 306 where active devices are later fabricated. Typically, the first damaged regions 312 include a plurality of bubbles 313 disposed horizontally. The first damaged regions 312 are formed at a depth (first distance) 311 from the first areas 306. The depth at which first damaged areas are formed varies, depending on the energy of the implants utilized. Note that the implants may also cause damages 314 in the patterned areas 304.

Figure 6:
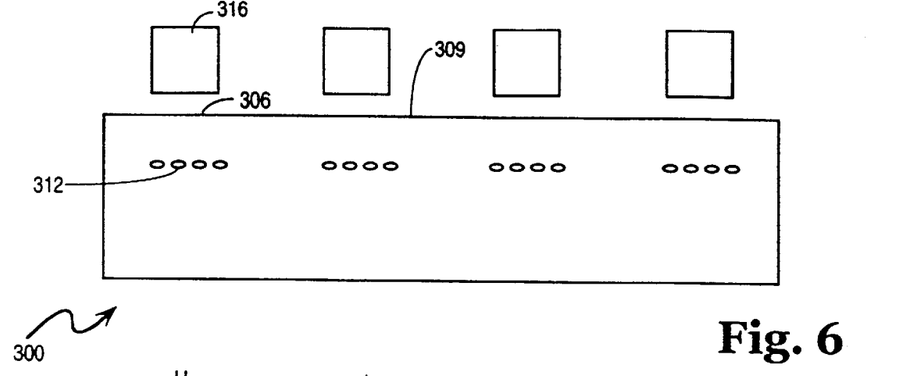
FIG. 6 illustrates a cross-sectional view through a substrate with active devices formed onto the silicon substrate in alignment with first damaged regions.

Next, active devices are formed onto first areas 306 by way of conventional activation processes. FIG. 6 illustrates a cross-sectional view through silicon substrate 300 with active devices 316 formed onto first areas 306.

Figure 7:
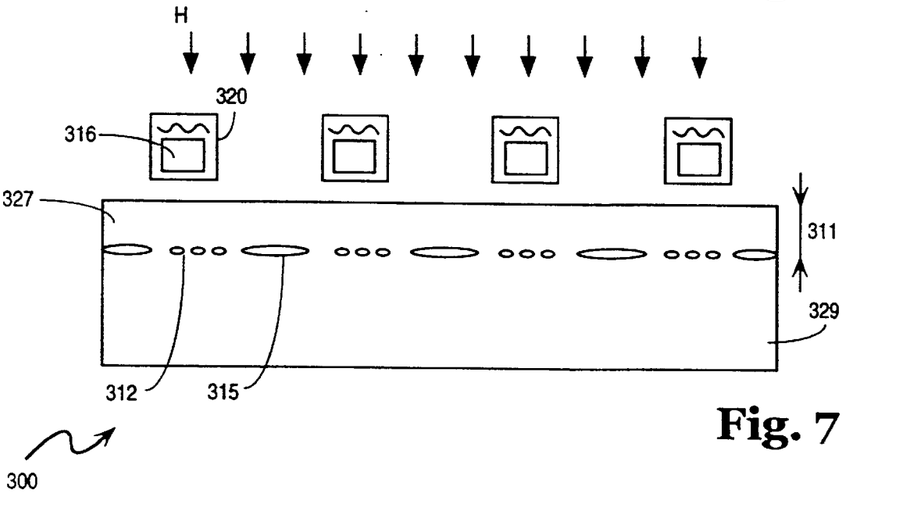
FIG. 7 illustrates a cross-sectional view through the substrate shown in FIG. 6 subjected to a second implantation process.

The process then continues with a second implantation into the areas 309 that separate therebetween active devices 316. FIG. 7 illustrates a cross-sectional view through the silicon substrate 300 undergoing a second implantation process. The active devices 316 are masked by isolation masks 320, that may be made of nitride but are not limited thereto, to protect the active devices from damages during the second implantation process. Second implants typically include hydrogen which causes voids 315 (second damaged regions) between the first damaged regions 312.

Masks 320 protect transistors 316 from being damaged during the second implantation process. After the second implantation process, second damaged regions have been formed in the substrate 300. The first and second damaged regions separate film 327 with active devices 316 from the rest of the substrate 329.

Figure 8:
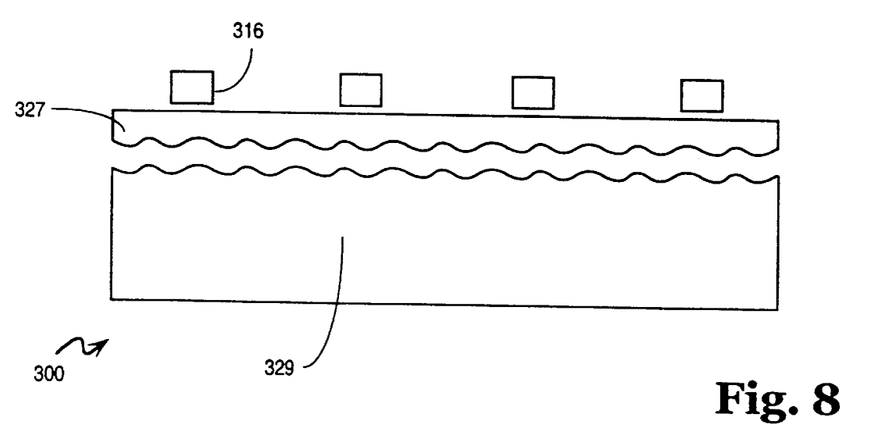
FIG. 8 illustrates a cross-sectional view through the substrate, where a film of active devices is delaminated as a result of an annealing process performed upon the structure illustrated in FIG. 7.

Next, masks 320 are removed by etching. An annealing process is performed on the structure with the cross-section illustrated in FIG. 7. The annealing takes place at a temperature that typically does not exceed 400° Celsius. FIG. 8 illustrates a cross-sectional view through the silicon substrate 300 at the end of the annealing process. The annealing process causes the voids (second damaged regions) 315 to expand such that film 327 delaminates from the rest of the substrate 329. The thickness of film 327 is approximately 1 $\mu$m to 1 $\mu$m. As the structure illustrated in FIG. 7 is heated up, the coefficient of thermal expansion and pressure of the hydrogen gas in the voids 315 cause sufficient stress in the second damaged regions to propagate cracks into the first damaged region thereby causing delamination of film 327 from the rest 329 of substrate 300.

Delaminated thin film 327 with active devices 316 may then be later used in connection with different structures utilized in fabrication of integrated circuits. For example, the thin film 327 with active devices 316 may be utilized as a second layer of active devices, in the Z dimension, in connection with a substrate that already has a first layer of active devices.

Figure 9:
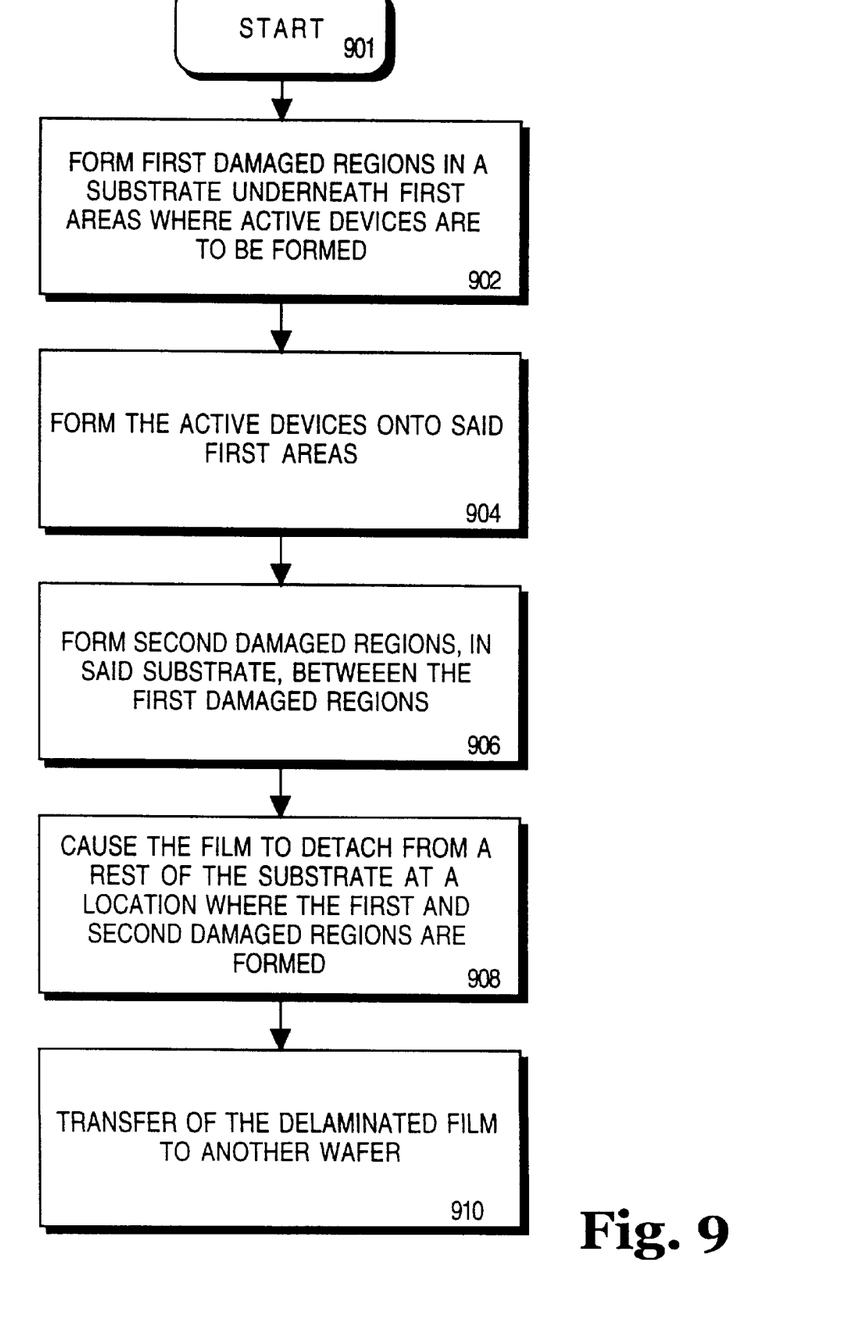
FIG. 9 illustrates a flowchart diagram in connection with one embodiment of the process for forming a film of active devices according to the present invention.

FIG. 9 illustrates a flowchart diagram in connection with the embodiment of the process according to the present invention discussed above. The process starts a block 901 from where it passes to block 902. At block 902 first damaged regions are formed in a substrate underneath first areas where active devices are to be formed. From block 902 the process passes to block 904 where said active devices are formed onto the first areas. The process then flows to block 906 where second damaged regions are formed in the substrate between the first damaged regions. The process then flows to block 908 where a film is caused to detach from the rest of the substrate at a location where the first and second damaged regions are formed. Next, at block 910, the delaminated film is transferred to another wafer.

Figure 10:
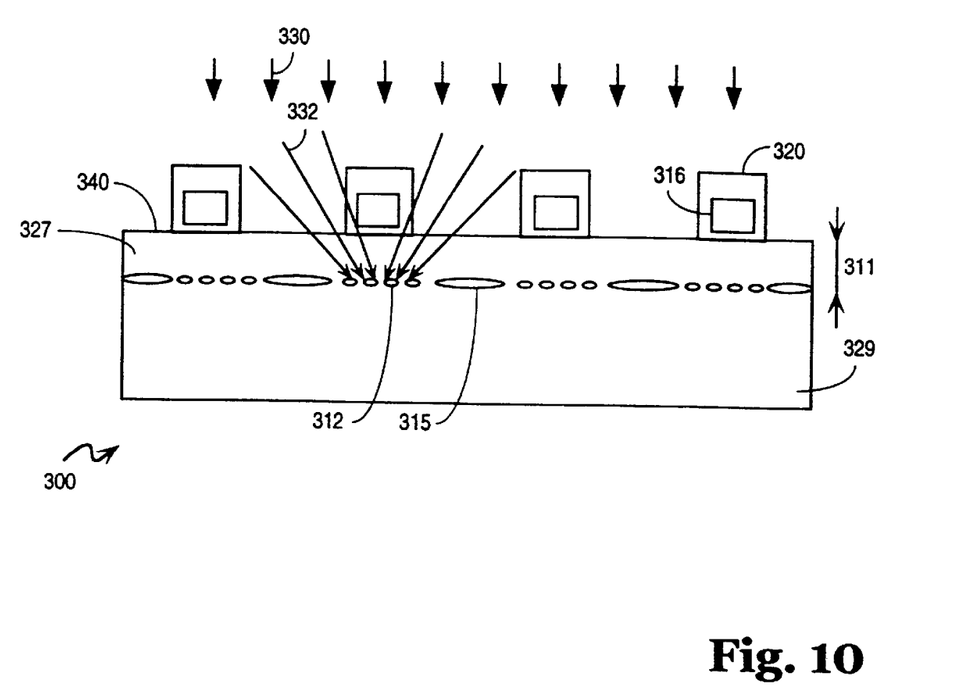
FIG. 10 illustrates a cross-sectional view through a substrate subjected to a process of forming a pre-fabricated layer of active devices according to an alternative embodiment of the process of the present invention.

FIG. 10 illustrates a cross-sectional view through a substrate 300 with masked active devices 316 upon which a process according to an alternative embodiment of the present invention is performed. Instead of pre-damaging the areas that are underneath the transistors, as explained above, the process according to the alternative embodiment of the present invention utilizes angled implants of hydrogen and/or helium or other damage-creating implants that are made both perpendicularly (arrows 330) to the top surface 340 of the substrate and also at different angles (arrows 332) to the top surface. The implants made at an angle different than 90° are utilized to produce the first damaged area 312 while devices 316 are protected by way of masks 320. The implants made at 90° with respect to surface 340 produce the second damaged areas 315 at a depth beneath top surface 340 substantially equal to the depth of which first damaged areas 312 are produced. The film may be detached by introducing mechanical constraints to a system that includes the rest 329 of substrate 300 and layer (film) 327. One way to detach film 327 includes annealing the system including the rest of substrate 329 and film 327. After damaged regions 312 and 315 are produced, an annealing process is performed which causes delamination of the layer 327 from the rest 329 of substrate 300.

In the foregoing specification, the invention has been described with reference to specific embodiments thereof. It will however be evident that various modification and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. A method of fabricating a film of active devices, the method comprising:
   a. forming first damaged regions in a substrate underneath first areas where active devices are to be formed;
   b. forming said active devices onto said first areas;
   c. forming second damaged regions, in said substrate, between said first damaged regions; and
   d. causing said film to detach from a rest of said substrate at a location where said first and second damaged regions are formed.

2. The method of claim 1 wherein said first damaged regions are formed by way of ion implantation.

3. The method of claim 1 wherein forming first damaged regions includes masking second areas between said first areas.

4. The method of claim 3 wherein forming first damaged regions further includes implanting said substrate with a noble gas to create said first damaged regions.

5. The method of claim 3 wherein forming first damaged regions further including implanting said substrate with a substance including a noble gas.

6. The method of claim 5 wherein said substance further includes hydrogen.

7. The method of claim 6 wherein said substance further includes oxygen.

8. The method of claim 4 wherein said noble gas includes helium.

9. The method of claim 1 wherein forming second damaged regions includes masking said active devices and implanting said substrate with a gas.

10. The method of claim 9 wherein said gas includes hydrogen.

11. The method of claim 1 wherein causing said film to detach includes annealing said substrate at a temperature within a range of approximately 150° Celsius to 400° Celsius.

12. The method of claim 1 wherein causing said film to detach includes introducing mechanical constraints to a system including said substrate and said film.

13. A method of fabricating a film of active devices, the method comprising the steps of:
   a forming active devices onto first areas of a substrate, said first areas separated by second areas;
   implanting a number of ions into said substrate, said number of ions including first and second number of ions, said first number of ions implanted at angles with said first areas, said first number of ions causing first damaged regions underneath said first areas at a depth from said first area, said second number of ions implanted perpendicularly to said second areas, said second number of ions causing second damaged regions at substantially the same depth underneath the second areas; and
   causing said film to detach from a rest of said substrate at a location substantially corresponding to said first and second damaged regions.

14. The method of claim 13 wherein said ions include hydrogen.

15. The method of claim 13 where said ions include helium.

16. The method of claim 13 wherein said devices are masked.

* * * * *